(12) United States Patent
Sato et al.

(10) Patent No.: US 10,201,886 B2
(45) Date of Patent: Feb. 12, 2019

(54) POLISHING PAD AND METHOD FOR MANUFACTURING THE SAME

(71) Applicants: FUJIBO Holdings, Inc., Chuo-ku, Tokyo (JP); Shin-Etsu Handotai Co., Ltd, Chiyoda-ku, Tokyo (JP)

(72) Inventors: Michito Sato, Fukushima (JP); Junichi Ueno, Fukushima (JP); Kaoru Ishii, Fukushima (JP); Yoshihide Kawamura, Saijo (JP); Hiroshi Yoshida, Saijo (JP); Masataka Takagi, Saijo (JP)

(73) Assignees: FUJIBO HOLDINGS, INC., Chuo-ku, Tokyo (JP); SHIN-ETSU HANDOTAI CO., LTD., Chiyoda-ku, Tokyo (JP)

( * ) Notice: Subject to any disclaimer, the term of this patent is extended or adjusted under 35 U.S.C. 154(b) by 40 days.

(21) Appl. No.: 15/310,053

(22) PCT Filed: May 14, 2015

(86) PCT No.: PCT/JP2015/063949
§ 371 (c)(1),
(2) Date: Nov. 9, 2016

(87) PCT Pub. No.: WO2015/178289
PCT Pub. Date: Nov. 26, 2015

(65) Prior Publication Data
US 2017/0144266 A1 May 25, 2017

(30) Foreign Application Priority Data
May 21, 2014 (JP) .................................. 2014-105711

(51) Int. Cl.
*B24B 7/22* (2006.01)
*B24B 37/22* (2012.01)
(Continued)

(52) U.S. Cl.
CPC .............. *B24B 37/22* (2013.01); *B24B 37/24* (2013.01); *B24B 37/26* (2013.01); *H01L 21/30625* (2013.01)

(58) Field of Classification Search
CPC ......... B24B 37/22; B24B 37/24; B24B 37/26; H01L 21/30625
(Continued)

(56) References Cited

U.S. PATENT DOCUMENTS 5,212,910 A * 5/1993 Breivogel ............... B24B 37/22
 451/287
5,692,950 A * 12/1997 Rutherford ............. B24B 37/22
 451/285

(Continued)

FOREIGN PATENT DOCUMENTS

JP 2012-101339 A 5/2012
JP 2013-199618 A 10/2013

*Primary Examiner* — Robert Rose
(74) *Attorney, Agent, or Firm* — Squire Patton Boggs (US) LLP

(57) ABSTRACT

Provided is a polishing pad capable of sufficiently reducing minute defects to be generated after polishing on a workpiece which are detected in measurement for a particle size of 26 nm or smaller and capable of providing the workpiece with excellent surface flatness. The polishing pad includes a polishing layer having a polishing surface to polish a workpiece, and includes, in the side opposite to the polishing surface of the polishing layer, an intermediate layer having an amount of deformation C larger than that of the polishing layer, a hard layer having an amount of deformation C smaller than that of the polishing layer, and a cushion layer having an amount of deformation C larger than that of the intermediate layer, in which each of the amounts of deformations C is defined as an amount of deformation in the case of compression in a thickness direction, and the intermediate (Continued)

layer, the hard layer, and the cushion layer are laminated in this order from the side of the polishing layer.

16 Claims, 3 Drawing Sheets

(51) Int. Cl.
*B24B 37/24* (2012.01)
*B24B 37/26* (2012.01)
*H01L 21/306* (2006.01)

(58) Field of Classification Search
USPC .......................... 451/526, 527, 533, 534, 539
See application file for complete search history.

(56) References Cited

U.S. PATENT DOCUMENTS

| | | | | |
|---|---|---|---|---|
| 6,632,129 B2 * | 10/2003 | Goetz | ...................... | B24B 37/22 |
| | | | | 451/527 |
| 6,666,751 B1 * | 12/2003 | Wang | ...................... | B24B 37/22 |
| | | | | 257/E21.23 |
| 10,071,460 B2 | 9/2018 | Tateno et al. | | |

* cited by examiner

[Figure 1]
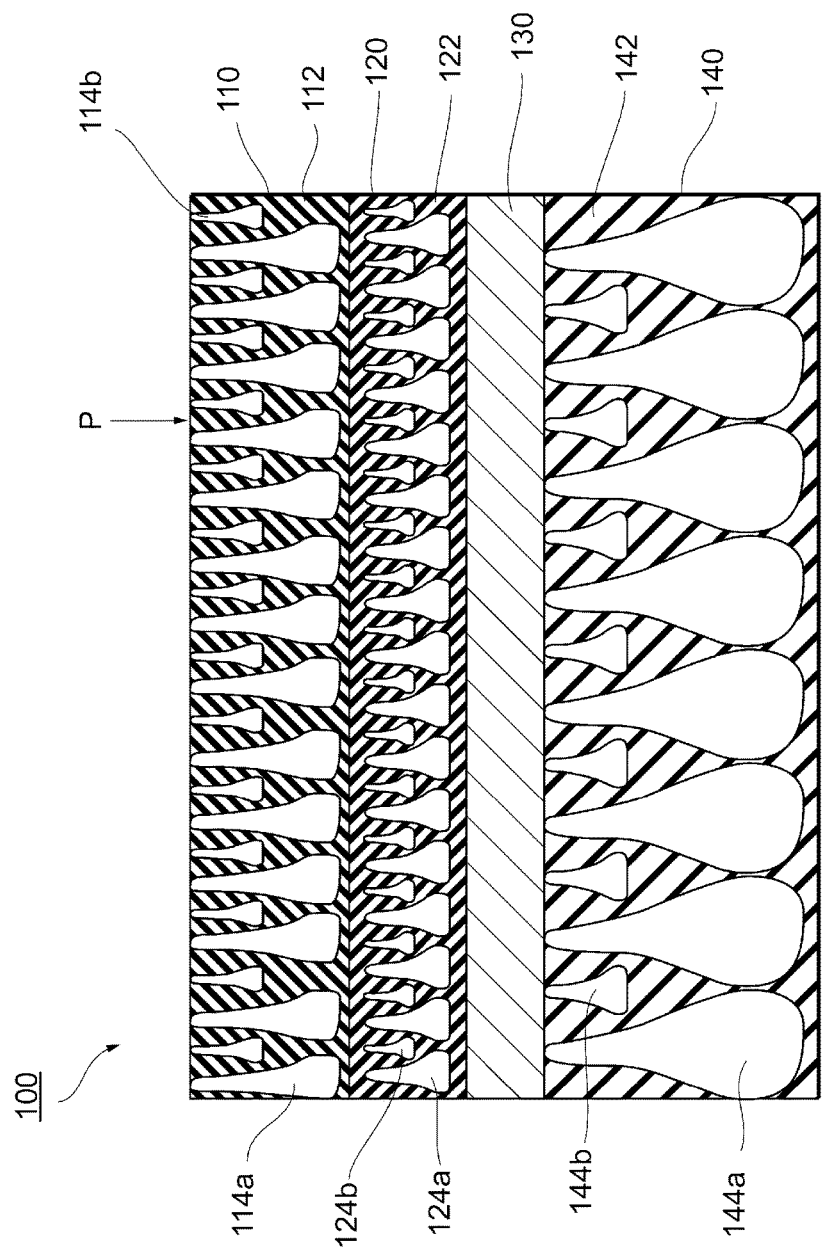

[Figure 2]
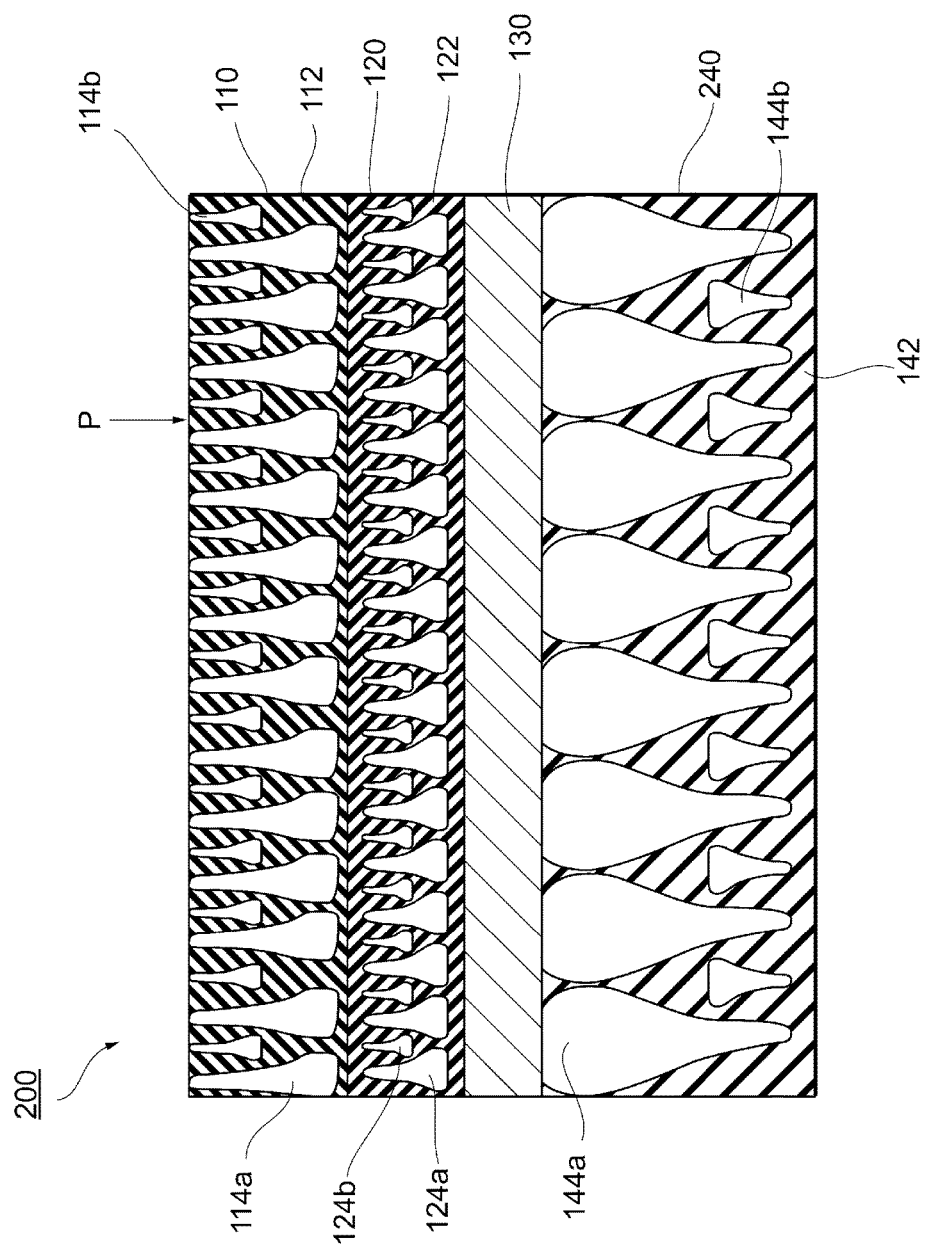

[Figure 3]

| Measurement mode | High sensitivity | Ultrahigh sensitivity | | | | |
|---|---|---|---|---|---|---|
| Particle size | 26nm | 22nm | 21nm | 20nm | 19nm | 18nm |
| Comparative Example 1 | | | | | | |
| Comparative Example 4 | | | | | | |
| Example 6 | | | | | | |
| Example 8 | | | | | | |

POLISHING PAD AND METHOD FOR MANUFACTURING THE SAME

TECHNICAL FIELD

The present invention relates to a polishing pad and a method for manufacturing the same.

BACKGROUND ART

Conventionally known polishing cloths for final polishing of a semiconductor wafer are a polishing cloth having a two-layered structure including a suede-like soft polishing layer and a supporting layer of a nonwoven fabric impregnated with polyurethane, and a polishing cloth having a three-layered structure in which a non-foamed PET sheet layer is sandwiched between the two-layered structure. For example, Patent Document 1 discloses a final polishing pad to be used for forming a satisfactory mirror surface on a silicon bare wafer, a glass, a compound semiconductor substrate, a hard disk substrate, or the like, and the polishing pad is intended to provide stable polishing characteristics such that fewer defects such as a scratch and a particle are generated after polishing on a surface to be mirror-polished and the mirror-polished surface has smaller surface roughness, and thus to be suitable for finishing. In particular, the patent document discloses a polishing pad in FIG. 1 and the specification, in which a porous polyurethane layer (c), a plastic film (e), and a foamed plastic layer (d) are laminated in this order from the top to form a polishing sheet (a), and a cushion sheet (b) consisting of a foamed plastic is further laminated in the bottom side of the polishing sheet with a plastic sheet (f) sandwiched therebetween, and a back tape (g) is pasted on the bottom of the cushion sheet (b). The patent document further discloses that the plastic film (e) preferably has a thickness of 10 to 45 μm and an average tensile elastic modulus of 3.5 GPa or higher and 5.5 GPa or lower.

CITATION LIST

Patent Document

Patent Document 1: Japanese Patent Laid-Open No. 2012-101339

SUMMARY OF INVENTION

Technical Problem

Miniaturization of semiconductor wafers has been further progressed in recent years, and as a result scratches having a depth of several nanometers, protrusions having a height of several nanometers, or the like have been considered as a defect which influences on device characteristics. Such minute defects can be detected with a particle measuring apparatus, which is represented by a wafer surface inspection system (product name: "Surfscan SP2") manufactured by KLA-Tencor Corporation. In addition, a particle measuring apparatus having further improved detection sensitivity (a wafer surface inspection system manufactured by KLA-Tencor Corporation (product name: "Surfscan SP3")) has also been introduced, and has enabled measurement of minute defects to a particle size of about 26 nm. Moreover, use of a semiconductor wafer having reduced wafer surface roughness (hereinafter, referred to as "haze"), which may cause a background noise of a measuring apparatus, or a measuring apparatus having a function to remove the influence of haze has enabled measurement of defects having even a particle size of 26 nm or smaller.

Accordingly, the present inventors used a low-haze wafer which allows for measurement of defects having a particle size of 26 nm or smaller on the wafer to measure minute defects on the semiconductor wafer polished with a conventional polishing pad. Then, marks of polishing trajectories (hereinafter, referred to as "polishing mark") in an appearance of scratches, which were generated presumably due to a rotational trajectory of a polishing head or a polishing platen, were detected for a particle size of about 22 nm. Such polishing marks are highly likely to influence the properties of a device of 22 nm generation or later. Thus, a polishing technique which enables reduction of such minute defects to be generated on a workpiece such as a semiconductor wafer is required, and such reduction needs to be achieved in combination with the surface flatness of a polished object.

The present invention has been made in view of the above circumstance, and it is an object of the present invention to provide a polishing pad capable of sufficiently reducing minute defects to be generated after polishing on a workpiece which are detected in measurement for a particle size of 26 nm or smaller and capable of providing the workpiece with excellent surface flatness, and a method for manufacturing the polishing pad.

Solution to Problem

As a result of a diligent research to achieve the above object, the present inventors found that polishing a semiconductor wafer with a polishing pad including at least four predetermined layers laminated can sufficiently reduce minute defects to be generated after polishing on the semiconductor wafer which are detected in measurement for a particle size of 26 nm or smaller (hereinafter, simply referred to as "minute defects"), and can provide the semiconductor wafer with excellent surface flatness, and thus the present inventors completed the present invention.

Specifically, the present invention is as follows.

[1] A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer.

[2] The above polishing pad, wherein the polishing layer has a thickness of 0.20 to 0.70 mm, the intermediate layer has a thickness of 0.20 to 0.60 mm, the hard layer has a thickness of 0.10 to 0.50 mm, and the cushion layer has a thickness of 0.40 to 1.3 mm.

[3] The above polishing pad, wherein a total thickness of the polishing layer and the intermediate layer, and the thickness of the cushion layer are both 0.40 to 1.3 mm.

[4] The above polishing pad, wherein an average opening diameter of openings in the polishing surface of the polishing layer is 10 to 50 μm.

[5] The above polishing pad, wherein the polishing layer, the intermediate layer, and the cushion layer each independently contain at least one resin selected from the group consisting of a polyurethane resin, a polysulfone resin, and a polyimide resin, and the hard layer contains at least one resin selected from the group consisting of a polyethylene terephthalate resin, a vinyl chloride resin, and a polyethylene resin.

[6] The above polishing pad, wherein the polishing layer, the intermediate layer, and the cushion layer are each a sheet formed by using a wet film-forming method, and a resin constituting the polishing layer, a resin constituting the intermediate layer, and a resin constituting the cushion layer have a 100% modulus of 8 to 25 MPa, 4 to 20 MPa, and 3 to 20 MPa, respectively.

[7] The above polishing pad to be used for polishing a silicon wafer.

[8] A method for manufacturing any one of the above polishing pads, including: laminating, on a polishing layer having a polishing surface to polish a workpiece and having a 100% modulus of 8 to 25 MPa, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, in the side opposite to the polishing surface of the polishing layer, in this order from the side of the polishing layer.

Advantageous Effects of Invention

The present invention can provide a polishing pad capable of sufficiently reducing minute defects to be generated after polishing on a workpiece which are detected in measurement for a particle size of 26 nm or smaller and capable of providing the workpiece with excellent surface flatness, and a method for manufacturing the polishing pad.

BRIEF DESCRIPTION OF DRAWINGS

FIG. 1 is a cross-sectional view schematically illustrating one example of a polishing pad according to the present invention.

FIG. 2 is a cross-sectional view schematically illustrating another example of a polishing pad according to the present invention.

FIG. 3 shows images of minute defects obtained by using an apparatus to evaluate minute defects on a polished object.

DESCRIPTION OF EMBODIMENTS

Hereinafter, modes for carrying out the present invention (hereinafter, simply referred to as "the present embodiment") will be described in detail with reference to drawings, as necessary, but the present invention is never limited to the following embodiments of the present invention. The present invention can be carried out with various modifications within a range which does not deviate from the gist of the present invention. In drawings, each of identical elements has an identical reference sign, and redundant descriptions are omitted. The positional relation such as top and bottom, and left and right is based on the positional relation shown in the drawing unless otherwise stated. Further, the dimension ratio of a drawing is not limited to the ratio as illustrated.

FIG. 1 is a cross-sectional view schematically illustrating one example of a polishing pad according to the present embodiment. A polishing pad 100 includes a polishing layer 110, an intermediate layer 120, a hard layer 130, and a cushion layer 140 laminated in this order. The polishing layer 110 has a polishing surface P which directly contacts with a workpiece when a workpiece is polished with the polishing pad 100.

(Polishing Layer)

The polishing layer 110 includes a matrix 112 and a plurality of pores 114a present inside the matrix 112, and is a layer formed by using what is called a wet film-forming method. The plurality of pores 114a are preferably interconnected, that is, preferably has what is called an open cell structure, although not illustrated. The polishing layer 110 is preferably a layer formed by using a wet film-forming method from the viewpoint of controlling the amount of deformation D, which is to be described later, within a predetermined numerical range, but the method for forming the polishing layer 110 is not limited thereto.

In the case that the polishing layer 110 is a layer formed by using a wet film-forming method, the polishing layer 110 may include, in the side of the polishing surface P, a skin layer region in which a plurality of minute micropores 114b is formed. The surface of the skin layer region (i.e., the polishing surface P) has openings. The three-dimensional shape of the pores 114a and the micropores 114b is not limited, and may be any one or more of a generally spherical shape, and a vertically long (i.e., long in the thickness direction of the polishing layer 110) cone and spindle shape. The three-dimensional shape of the pores 114a and the micropores 114b is preferably a vertically long cone and spindle shape as illustrated from the viewpoint of allowing the polishing pad 100 to retain a slurry more easily and contain polishing debris.

At least a part of the pores 114a and the micropores 114b has an opening which is opening through the skin layer region to the polishing surface P. The pores 114a and the micropores 114b having an opening enable more effective incorporation and retention of a slurry used in polishing by using a chemical and mechanical polishing method. When a workpiece is pressed onto the polishing pad 100, the slurry retained in the pores 114a and the micropores 114b is discharged from the openings and supplied between the workpiece and the polishing pad 100. As described, the pores 114a and the micropores 114b having an opening enable supplying a slurry onto the polishing surface P when a workpiece as a polishing target is present, and thus a slurry can be consumed more effectively. By observing a cross-section obtained by cutting the polishing layer 110 with a scanning electron microscope, it can be confirmed that the pores 114a and the micropores 114b are formed.

The average opening diameter of the openings in the polishing surface P is preferably 10 to 50 μm, and more preferably 20 to 35 μm. Controlling the average opening diameter to 10 μm or larger enables supplying a slurry more homogeneously and the polishing rate and surface flatness can be further improved. Controlling the average opening diameter to 50 μm or smaller enables further reduction of minute defects including haze to be generated on the surface of a workpiece. The average opening diameter can be controlled through, for example, the blending ratio and types of a resin in the matrix 112 (hereinafter, referred to as "matrix resin"), a film-forming forming agent, and a foam-controlling agent, conditions or the like for a pore-forming process, and the amount of a skin layer to be ground. The average opening diameter of the polishing layer 110 is measured as follows: first, a rectangle region of 1.0 mm×1.4 mm is arbitrarily selected from the polishing surface P of the polishing layer 110; the rectangle region is observed with a laser microscope (e.g., product name "VK-X105" manufactured by KEYENCE CORPORATION) at a magnification of ×200 to acquire an image thereof; subsequently, the image acquired is binarized with an image analysis software (e.g., product name "WinRoof" manufactured by MITANI CORPORATION) to discriminate openings from other portions; from the area of each of the openings thus discriminated, the opening diameter of the opening is then calculated as an equivalent circle diameter, that is, a diameter under the assumption that the opening is true circle; and the arithmetic average of the opening diameters of the openings is used as the average opening diameter (μm). It is preferred that at least a part of the polishing surface P have an average opening diameter in the above range, and it is more preferred that all of the polishing surface P have an average opening diameter in the above range.

The polishing layer 110 preferably has a composition in which a matrix resin in the matrix 112 is the most abundant component. For example, the polishing layer 110 may contain a matrix resin at a content of 70 to 100% by mass based on the total amount. The polishing layer 110 contains a matrix resin more preferably at a content of 70 to 90% by mass, even more preferably at a content of 75 to 90% by mass based on the total amount.

Examples of the matrix resin include polyurethane resins, polysulfone resins, and polyimide resins. One of these is used singly, or two or more thereof are used in combination, and the matrix resin may be a matrix resin used for a resin sheet part of a conventional polishing pad. Among them, polyurethane resins are preferred from the viewpoint of achieving the object of the present invention more effectively and reliably. The content of the polyurethane resin in the matrix resin is preferably 50% by mass or more, more preferably 80% by mass or more, even more preferably 90% by mass or more, and particularly preferably 95% by mass or more.

Examples of the polyurethane resin include polyester polyurethane resins, polyether polyurethane resins, polyester-ether polyurethane resins, and polycarbonate polyurethane resins. One of these is used singly, or two or more thereof are used in combination. Among them, polyether polyurethane resins are preferred from the viewpoint of excellent hydrolysis resistance.

The polyurethane resin may be synthesized by using a conventional method, or a commercial product thereof may be used. Examples of the commercial product include CRISVON (product name, manufactured by DIC Corporation), Sunprene (product name, manufactured by Sanyo Chemical Industries, Ltd.), and RESAMINE (product name, manufactured by Dainichiseika Color & Chemicals Mfg. Co., Ltd.).

The polysulfone resin may be synthesized by using a conventional method, or a commercial product thereof may be used. Examples of the commercial product include Udel (product name, manufactured by Solvay Advanced Polymers L.L.C.).

The polyimide resin may be synthesized by using a conventional method, or a commercial product thereof may be used. Examples of the commercial product include AURUM (product name, manufactured by Mitsui Chemicals, Inc.).

The polishing layer 110 may contain, in addition to the matrix resin, one or two or more materials commonly used for a polishing layer of a polishing pad. Examples of such a material include pigments such as carbon black, film-forming agents such as nonionic surfactants having a molecular weight of 5000 or lower, and foam-controlling agents such as anionic surfactants having a molecular weight of 5000 or lower. These optional materials may be used to control the size, number, and shape of the pores 114a and the micropores 114b within a range which does not interfere with problem solving by the present invention. Film-forming agents agglomerate or modify a slurry, and it is thus preferred to use no film-forming agents or to finally remove a film-forming agent from the polishing layer 110. In addition, various materials such as a solvent used in the course of manufacturing the polishing layer 110 may remain in the polishing layer 110 within a range which does not interfere with problem solving by the present invention.

The 100% modulus of the resin constituting the polishing layer 110 is preferably 8 to 25 MPa, more preferably 9 to 23 MPa, and even more preferably 10 to 20 MPa. Controlling the 100% modulus to 8 MPa or higher enables ensuring a sufficient polishing rate, and controlling the 100% modulus to 25 MPa or lower enables further reduction of minute defects to be generated on a workpiece. A 100% modulus refers to a value obtained by dividing a tensile force when a non-foamed sheet (test piece) of the same material, as a layer to be measured, is elongated to 100% elongation, in other words, elongated to a length twice the original length under an environment of room temperature (23±2° C.), by the initial cross-sectional area of the test piece.

The amount of deformation D of the polishing layer 110 is preferably 15 to 106 μm, and more preferably 18 to 53 μm. The amount of deformation D and amount of deformation C, which is to be described later, of each layer are considered to be one of indicators of flexibility of the layer. Controlling the amount of deformation D of the polishing layer 110 to 15 μm or larger allows polishing debris and abrasive grains to be moderately compressed into the polishing layer 110, which enables further reduction of minute defects to be generated on a workpiece. Controlling the amount of deformation D of the polishing layer 110 to 106 μm or smaller enables further improvement of the surface flatness to be imparted to the surface to be polished of a workpiece, such as global flatness and edge roll-off prevention. In the present specification, the amount of deformation D of each layer is measured as follows: first, compressibility is measured for each layer in accordance with a method to be described later in Examples; and the compressibility is then multiplied by the thickness of the corresponding layer to determine the amount of deformation. Thus, it follows that amount of deformation D=t0−t1. Here, the thickness of each layer is an arithmetic average of thicknesses measured at 5 points, the corners and the center, in a rectangle sample of 10 cm×10 cm.

The thickness of the polishing layer 110 is preferably 0.20 to 0.70 mm, more preferably 0.30 to 0.60 mm, and even more preferably 0.40 to 0.50 mm. Controlling the thickness to 0.20 mm or larger enables further reduction of minute defects to be generated on a workpiece, and controlling the thickness to 0.70 mm or smaller can prevent edge roll-off of a workpiece due to polishing.

For the polishing layer 110, the ratio of the amount of deformation D to the thickness is preferably 0.021 to 0.53, more preferably 0.030 to 0.18, even more preferably 0.035 to 0.11, particularly preferably 0.038 to 0.075, and extremely preferably 0.045 to 0.065. Controlling the ratio to 0.021 or more enables further reduction of minute defects to be generated on a workpiece, and controlling the ratio to 0.53 or less enables further improvement of the surface flatness to be imparted to a surface to be polished.

The compressibility of the polishing layer 110 is preferably 3.0 to 15%, and more preferably 4.0 to 13%. Controlling the compressibility within the range enables polishing pad 100 to remove a slurry and polishing debris present on a workpiece via moderate wiping out in polishing. Accordingly, minute defects due to polishing debris or an agglomerate of a slurry can be further reduced in particular. The compressibility can be controlled by, for example, adjusting the size and number of the pores 114a and the micropores 114b in the polishing layer 110. The compressibility is measured in accordance with a method to be described later in Examples.

The compressive elastic modulus of the polishing layer 110 is preferably 50 to 100%, and more preferably 70 to 100%. Controlling the compressive elastic modulus within the range enables further reduction of minute defects to be generated on a workpiece. The compressive elastic modulus can be controlled by, for example, adjusting the type and composition of a matrix resin to be used for the polishing layer 110, and/or the foam structure (the shape and number of the pores 114a and the micropores 114b). The compressive elastic modulus is measured in accordance with a method to be described later in Examples.

The density (bulk density) of the polishing layer 110 is preferably 0.10 to 0.30 g/cm$^3$, and more preferably 0.13 to 0.25 g/cm$^3$. Controlling the density to 0.10 g/cm$^3$ or higher can further prevent abrasive grains from being completely buried in the polishing layer 110, and as a result the polishing rate can be further enhanced. On the other hand, controlling the density to 0.30 g/cm$^3$ or lower can prevent abrasive grains which are not buried in the polishing surface from scratching a workpiece more effectively and reliably, and as a result minute defects to be generated on a workpiece can be further reduced. The density of each layer can be determined from the mass and dimensions (volume) at 25° C. of a test piece cut out of each layer in predetermined dimensions.

The durometer hardness (Type A) of the polishing layer 110 is preferably 15 to 50°, and more preferably 20 to 40°. Controlling the durometer hardness to 15° or higher enables further enhancement of the polishing rate, and further improvement of the global flatness to be imparted to a surface to be polished of a workpiece through polishing. Controlling the durometer hardness to 40° or lower enables further reduction of minute defects to be generated on a workpiece. Durometer hardness (Type A) is one at 25° C., and is measured in accordance with Japanese Industrial Standards (JIS K 6253). More specifically, durometer hardness is measured for a sample having the dimensions 30 mm×30 mm by using a Shore A durometer in accordance with JIS K 7311.

The polishing layer 110 may be provided with a groove (not illustrated) on the polishing surface P. The groove provided supplies abrasive grains onto the polishing surface P and discharges them from the polishing surface P more effectively and reliably, and thereby further enhances the polishing rate. In addition, the groove provided discharges polishing debris generated in polishing more reliably, and thereby can further reduce scratches and minute defects. Examples of the planar shape of the groove include a spiral, concentric circles, radial lines, and a lattice. Two or more thereof may be used in combination. The cross-sectional shape of the groove may be a V-shape, rectangle, a U-shape, or a semicircle. The groove can be easily provided in a desired pattern and shape by using conventional cutting or the like.

(Intermediate Layer)

The intermediate layer 120 is a layer provided to further improve the following property of the polishing layer 110 to a workpiece, in particular the following property in a relatively small region. The intermediate layer 120 includes a matrix 122 and a plurality of pores 124a present inside the matrix 122, and is a layer formed by using what is called a wet film-forming method. The intermediate layer 120 is preferably a layer formed by using a wet film-forming method from the viewpoint of controlling the amount of deformation D, which is to be described later, within a predetermined numerical range, but the method for forming the intermediate layer 120 is not limited thereto.

In the case that the intermediate layer 120 is a layer formed by using a wet film-forming method, the intermediate layer 120 may include, in the side of the polishing layer 110 or the hard layer 130, a skin layer region in which a plurality of minute micropores 124b is formed. In FIG. 1, a skin layer region is included in the side of the polishing layer 110. The surface of the skin layer has microscopic flatness. The three-dimensional shape of the pores 124a and the micropores 124b is not limited, and may be any one or more of a generally spherical shape, and a vertically long (i.e., long in the thickness direction of the intermediate layer 120) cone and spindle shape. The three-dimensional shape of the pores 124a and the micropores 124b is preferably a vertically long cone and spindle shape as illustrated from the viewpoint of further enhancement of the following property of the polishing layer 110 to a workpiece.

At least a part of the pores 124a and the micropores 124b may have an opening. In addition, the following property of the polishing layer 110 can be further enhanced by homogenizing the thickness of the intermediate layer 120 through buffing or the like. By observing a cross-section obtained by cutting the intermediate layer 120 with a scanning electron microscope, it can be confirmed that the pores 124a and the micropores 124b are formed. Here, "buffing" refers to grinding the surface of a layer to smooth out thickness variation generated in film-forming of the layer or to adjust the thickness of the layer to an intended thickness.

The intermediate layer 120 preferably has a composition in which a matrix resin in the matrix 122 is the most abundant component. For example, the intermediate layer 120 may contain a matrix resin at a content of 70 to 100% by mass based on the total amount. The intermediate layer 120 contains a matrix resin more preferably at a content of 70 to 90% by mass, even more preferably at a content of 75 to 90% by mass based on the total amount.

Examples of the matrix resin include polyurethane resins, polysulfone resins, and polyimide resins. One of these is used singly, or two or more thereof are used in combination, and the matrix resin may be a matrix resin used for a resin sheet part of a conventional polishing pad. Among them, polyurethane resins are preferred from the viewpoint of achieving the object of the present invention more effectively and reliably. The content of the polyurethane resin in the matrix resin is preferably 50% by mass or more, more preferably 80% by mass or more, even more preferably 90% by mass or more, and particularly preferably 95% by mass or more.

Examples of the polyurethane resin include polyester polyurethane resins, polyether polyurethane resins, polyester-ether polyurethane resins, and polycarbonate polyurethane resins. One of these is used singly, or two or more thereof are used in combination. Among them, polyether polyurethane resins are preferred from the viewpoint of excellent hydrolysis resistance, which helps to achieve the object of the present invention more effectively and reliably.

The polyurethane resin may be synthesized by using a conventional method, or a commercial product thereof may be used. Examples of the commercial product include CRIS- VON (product name, manufactured by DIC Corporation), Sunprene (product name, manufactured by Sanyo Chemical Industries, Ltd.), and RESAMINE (product name, manufactured by Dainichiseika Color & Chemicals Mfg. Co., Ltd.).

The polysulfone resin may be synthesized by using a conventional method, or a commercial product thereof may be used. Examples of the commercial product include Udel (product name, manufactured by Solvay Advanced Polymers L.L.C.).

The polyimide resin may be synthesized by using a conventional method, or a commercial product thereof may be used. Examples of the commercial product include AURUM (product name, manufactured by Mitsui Chemicals, Inc.).

The intermediate layer 120 may contain, in addition to the matrix resin, one or two or more materials commonly used for a polishing layer of a polishing pad, examples of which include pigments such as carbon black, film-forming agents, and foam-controlling agents. These optional materials may be used to control the size, number, and shape of the pores 124a and the micropores 124b. In addition, various materials such as a solvent used in the course of manufacturing the intermediate layer 120 may remain in the intermediate layer 120 within a range which does not interfere with problem solving by the present invention.

The 100% modulus of the resin constituting the intermediate layer 120 is preferably 4 to 20 MPa, more preferably 5 to 18 MPa, and even more preferably 6 to 15 MPa. Controlling the 100% modulus to 4 MPa or higher enables ensuring a more satisfactory global flatness to be imparted to a workpiece, and controlling the 100% modulus to 20 MPa or lower enables further enhancement of the following property of the polishing layer 110 to a workpiece, and as a result minute defects to be generated on a workpiece can be further reduced. From the same viewpoint, the 100% modulus of the resin constituting the intermediate layer 120 is preferably equal to or lower than the 100% modulus of the resin constituting the polishing layer 110, more preferably lower than the 100% modulus of the resin constituting the polishing layer 110, and even more preferably lower than the 100% modulus of the resin constituting the polishing layer 110 by 5 MPa or more.

The amount of deformation C of the intermediate layer 120 is larger than the amount of deformation C of the polishing layer 110. This allows the intermediate layer 120 to sufficiently support the following property of the polishing layer 110 to a workpiece, and thus minute defects can be reduced. In the present specification, relation among the amounts of deformation C of the layers is determined as follows: a polishing pad is totally compressed in the thickness direction (lamination direction of the layers) at a load of 1 kgf/cm² with a compression tester; the cross-section of each layer to be included in the polishing pad is observed before and after the compression with a microscope or the like to take an image thereof; from the images, the thicknesses of each layer before and after the compression are measured in length measurement; for each layer, the difference in thickness between before and after the compression is derived as the amount of deformation C; and the amounts of deformation C obtained for the layers are compared to determine the relation among the amounts of deformation C of the layers.

From the same viewpoint as in the case of relation among the amounts of deformation C, the amount of deformation D of the intermediate layer 120 is preferably larger than the amount of deformation D of the polishing layer 110. The amount of deformation D is preferably 20 to 300 μm, and more preferably 30 to 250 μm. Controlling the amount of deformation D to 20 μm or larger enables further enhancement of the following property of the polishing layer 110 to further reduce minute defects to be generated on a workpiece, and controlling the amount of deformation D to 300 μm or smaller enables further improvement of the global flatness to be imparted to the surface to be polished of a workpiece. From the same viewpoint, difference between the amount of deformation D of the intermediate layer 120 and the amount of deformation D of the polishing layer 110 is preferably 5 to 100 μm.

The thickness of the intermediate layer 120 is preferably 0.20 to 0.60 mm, more preferably 0.30 to 0.50 mm, and even more preferably 0.35 to 0.45 mm. Controlling the thickness to 0.20 mm or larger enables further reduction of minute defects to be generated on a workpiece, and controlling the thickness to 0.60 mm or smaller can prevent edge roll-off of a workpiece due to polishing more effectively and reliably. From the same viewpoint, the thickness of the intermediate layer 120 is preferably equal to or smaller than the thickness of the polishing layer 110, more preferably smaller than the thickness of the polishing layer 110, and even more preferably smaller than the thickness of the polishing layer 110 by 0.10 μm or more.

For the intermediate layer 120, the ratio of the amount of deformation D to the thickness is preferably 0.033 to 1.5, more preferably 0.060 to 0.83, and even more preferably 0.067 to 0.71. Controlling the ratio to 0.033 or more enables further enhancement of the following property of the polishing layer 110 to further reduce minute defects to be generated on a workpiece, and controlling the ratio to 1.5 or less enables further improvement of the global flatness to be imparted to the surface to be polished of a workpiece.

The compressibility of the intermediate layer 120 is preferably 10 to 60%. In addition, the compressibility of the intermediate layer 120 is preferably higher than the compressibility of the polishing layer 110. These allow the functions and effects of the present embodiment to be exerted more effectively and reliably. The compressive elastic modulus of the intermediate layer 120 is preferably 60 to 100%, and more preferably 70 to 100%. In addition, the compressive elastic modulus of the intermediate layer 120 is preferably equal to or higher than the compressive elastic modulus of the polishing layer 110, and more preferably higher than the compressive elastic modulus of the polishing layer 110. These enable further reduction of minute defects to be generated on a workpiece.

The density (bulk density) of the intermediate layer 120 is preferably 0.13 to 0.33 g/cm³, and more preferably 0.16 to 0.28 g/cm³. In addition, the density of the intermediate layer 120 is preferably equal to or higher than the density of the polishing layer 110, and more preferably higher than the density of the polishing layer 110. These allow the functions and effects of the present embodiment to be exerted more effectively and reliably.

The durometer hardness (Type A) of the intermediate layer 120 is preferably 5 to 38°, and more preferably 10 to 35°. Controlling the durometer hardness to 5° or higher enables further enhancement of the polishing rate, and further improvement of the global flatness to be imparted to a surface to be polished of a workpiece through polishing. Controlling the durometer hardness to 38° or lower enables further reduction of minute defects to be generated on a workpiece. From the same viewpoint, the durometer hardness (Type A) of the intermediate layer 120 is preferably lower than that of the polishing layer 110, and more preferably lower than that of the polishing layer 110 by 5° or more.

(Hard Layer)

The hard layer 130 is a layer provided to maintain the global flatness of a workpiece at a high level through polishing. The amount of deformation C of the hard layer 130 is the smallest among those of the four layers (polishing layer 110, intermediate layer 120, hard layer 130, and cushion layer 140), and examples of a material constituting the hard layer 130 include hard resins such as polyethylene terephthalate resins, vinyl chloride resins, and polyethylene resins; ceramics such as metal oxides; glass; FRP such as glass epoxy; and metals. The material constituting the hard layer 130 is preferably a material which provides the hard layer 130 with high thickness homogeneity and provides the adhesion surface of the hard layer 130 with high smoothness. From such a viewpoint, the material constituting the hard layer 130 preferably contains at least one resin selected from the group consisting of polyethylene terephthalate resins, vinyl chloride resins, and polyethylene resins, and more preferably contains a polyethylene terephthalate resin.

The amount of deformation C of the hard layer 130 is smaller than the amount of deformation C of the polishing layer 110. This enables maintaining the global flatness of a workpiece at a high level through polishing. From the same viewpoint, the amount of deformation D of the hard layer 130 is preferably smaller than the amount of deformation D of the polishing layer 110. The amount of deformation D is preferably 10 μm or smaller, and more preferably 6.0 μm or smaller to maintain the surface flatness of a workpiece, such as global flatness and edge roll-off prevention, at a high level. The lower limit of the amount of deformation D of the hard layer 130 is not limited, and the amount of deformation D may be 0.0 μm or more, or 1.0 μm or more.

The thickness of the hard layer 130 is preferably 0.10 to 0.50 mm, and more preferably 0.15 to 0.40 mm. Controlling the thickness to 0.10 mm or larger enables maintaining the surface flatness of a workpiece, such as global flatness and edge roll-off prevention, at an even higher level, and controlling the thickness to 0.50 mm or smaller enables reduction of manufacturing cost for the polishing pad 100. From the same viewpoint, the thickness of the hard layer 130 is preferably equal to or smaller than the thickness of the intermediate layer 120, more preferably smaller than the thickness of the intermediate layer 120, and even more preferably smaller than the thickness of the intermediate layer 120 by 0.10 mm or more.

For the hard layer 130, the ratio of the amount of deformation D to the thickness is preferably 0 to 0.10, and more preferably 0.0025 to 0.040. Controlling the ratio to 0.040 or less enables maintaining the surface flatness of a workpiece, such as global flatness and prevented edge roll-off, at an even higher level.

From the viewpoint of enhancement of the surface flatness to be imparted to a workpiece, such as global flatness and edge roll-off prevention, the compressibility of the hard layer 130 is preferably lower than those of the polishing layer 110 and the intermediate layer 120, and specifically, the compressibility of the hard layer 130 is preferably 5.0% or lower, and more preferably 3.0% or lower. The lower limit of the compressibility of the hard layer 130 is not limited, and the compressibility may be 0.0% or higher, or may be 0.5%, for example.

From the viewpoint of further enhancement of the surface flatness to be imparted to a workpiece, such as global flatness and edge roll-off prevention, the durometer hardness (Type A) of the hard layer 130 is preferably higher than those of the polishing layer 110 and the intermediate layer 120, and specifically, the durometer hardness of the hard layer 130 is preferably 50° or higher, and more preferably 70° or higher. The upper limit of the durometer hardness of the hard layer 130 is not limited, and the durometer hardness may be 100°, for example.

(Cushion Layer)

The cushion layer 140 is a layer provided to further enhance the global flatness to be imparted to a workpiece through polishing by further improving the following property of the polishing layer 110 to a workpiece, in particular the following property in a relatively large region. In contrast to the intermediate layer 120, which improves the following property in a relatively small region, the cushion layer 140 improves the following property in a relatively large region. This is presumably because the cushion layer 140 is disposed at a position more distant from the polishing layer 110 than the intermediate layer 120, and the hard layer 130, which as the smallest amount of deformation C, is disposed between the cushion layer 140 and the polishing layer 110. However, the contributing factor is not limited thereto.

The cushion layer 140 includes a matrix 142 and a plurality of pores 144a present inside the matrix 142, and is a layer formed by using what is called a wet film-forming method. The cushion layer 140 is preferably a layer formed by using a wet film-forming method from the viewpoint of controlling the amount of deformation D, which is to be described later, within a predetermined numerical range, but the method for forming the cushion layer 140 is not limited thereto.

In the case that the cushion layer 140 is a layer formed by using a wet film-forming method, the cushion layer 140 may include, in the side of the hard layer 130 or the opposite side, a skin layer region in which a plurality of minute micropores 144b is formed. In FIG. 1, a skin layer region is included in the side of the hard layer 130. The surface of the skin layer region has openings. The three-dimensional shape of the pores 144a and the micropores 144b is not limited, and may be any one or more of a generally spherical shape, and a vertically long (i.e., long in the thickness direction of the cushion layer 140) cone and spindle shape. The three-dimensional shape of the pores 144a and the micropores 144b is preferably a vertically long cone and spindle shape as illustrated from the viewpoint of further enhancement of the following property of the polishing layer 110 to a workpiece.

At least a part of the pores 144a and the micropores 144b may have an opening in at least one surface of the cushion layer 140. In addition, the effect to enhance global flatness by the cushion layer 140 can be exerted more effectively by further homogenizing the thickness of the cushion layer 140 through buffing or the like. By observing a cross-section obtained by cutting the cushion layer 140 with a scanning electron microscope, it can be confirmed that the pores 144a and the micropores 144b are formed.

The cushion layer 140 preferably has a composition in which a matrix resin in the matrix 142 is the most abundant component. For example, the cushion layer 140 may contain a matrix resin at a content of 70 to 100% by mass based on the total amount. The cushion layer 140 contains a matrix resin more preferably at a content of 70 to 90% by mass, even more preferably at a content of 75 to 90% by mass based on the total amount.

Examples of the matrix resin include polyurethane resins, polysulfone resins, and polyimide resins. One of these is used singly, or two or more thereof are used in combination, and the matrix resin may be a matrix resin used for a resin sheet part of a conventional polishing pad. Among them, polyurethane resins are preferred from the viewpoint of achieving the object of the present invention more effectively and reliably. The content of the polyurethane resin in the matrix resin is preferably 50% by mass or more, more preferably 80% by mass or more, even more preferably 90% by mass or more, and particularly preferably 95% by mass or more.

Examples of the polyurethane resin include polyester polyurethane resins, polyether polyurethane resins, polyester-ether polyurethane resins, and polycarbonate polyurethane resins. One of these is used singly, or two or more thereof are used in combination. Among them, polyester polyurethane resins are preferred from the viewpoint of being more excellent in control of the pores and mechanical properties.

The polyurethane resin may be synthesized by using a conventional method, or a commercial product thereof may be used. Examples of the commercial product include CRISVON (product name, manufactured by DIC Corporation), Sunprene (product name, manufactured by Sanyo Chemical Industries, Ltd.), and RESAMINE (product name, manufactured by Dainichiseika Color & Chemicals Mfg. Co., Ltd.).

The polysulfone resin may be synthesized by using a conventional method, or a commercial product thereof may be used. Examples of the commercial product include Udel (product name, manufactured by Solvay Advanced Polymers L.L.C.).

The polyimide resin may be synthesized by using a conventional method, or a commercial product thereof may be used. Examples of the commercial product include AURUM (product name, manufactured by Mitsui Chemicals, Inc.).

The cushion layer 140 may contain, in addition to the matrix resin, one or two or more materials commonly used for a polishing layer of a polishing pad, examples of which include pigments such as carbon black, film-forming agents, and foam-controlling agents. These optional materials may be used to control the size, number, and shape of the pores 144a and the micropores 144b. In addition, various materials such as a solvent used in the course of manufacturing the cushion layer 140 may remain in the cushion layer 140 within a range which does not interfere with problem solving by the present invention.

The 100% modulus of the resin constituting the cushion layer 140 is preferably 3 to 20 MPa, more preferably 6 to 20 MPa. Controlling the 100% modulus to 3 MPa or higher allows the cushion layer 140 to reduce edge roll-off of a workpiece caused by the polishing layer 110. Controlling the 100% modulus to 20 MPa or lower allows the cushion layer 140 to further improve the following property of the polishing layer 110 to a workpiece to enhance the global flatness, and thus minute defects can be further reduced. From the same viewpoint, the 100% modulus of the cushion layer 140 is preferably equal to or lower than the 100% modulus of the resins constituting the polishing layer 110 and the intermediate layer 120, and more preferably lower than the 100% modulus of the resins constituting the polishing layer 110 and the intermediate layer 120.

The amount of deformation C of the cushion layer 140 is larger than the amount of deformation C of the intermediate layer 120. This enables further enhancement of the following property of the polishing layer 110 to a workpiece, in particular the following property in a relatively large region, and the global flatness to be imparted to a workpiece through polishing can be further enhanced. From the same viewpoint, the amount of deformation D of the cushion layer 140 is preferably larger than the amount of deformation D of the intermediate layer 120. The amount of deformation D is preferably 55 to 650 μm, more preferably 100 to 600 μm, and even more preferably 300 to 550 μm. Controlling the amount of deformation D within the range enables further enhancement of the following property of the polishing layer 110 to further improve the global flatness to be imparted to a surface to be polished. From the same viewpoint, difference between the amount of deformation D of the cushion layer 140 and the amount of deformation D of the intermediate layer 120 is preferably 200 to 300 μm.

The thickness of the cushion layer 140 is preferably 0.40 to 1.3 mm, and more preferably 0.50 to 1.0 mm. Controlling the thickness to 0.40 mm or larger enables further reduction of minute defects to be generated on a workpiece, and controlling the thickness to 1.3 mm or smaller, more preferably to 1.0 mm or smaller, can prevent the occurrence of roll-off (edge roll-off) of a workpiece due to polishing more effectively and reliably. From the same viewpoint, the thickness of the cushion layer 140 is preferably equal to or larger than the thickness of the polishing layer 110, more preferably larger than the thickness of the polishing layer 110, and even more preferably larger than the thickness of the polishing layer 110 by 0.20 mm or more.

For the cushion layer 140, the ratio of the amount of deformation D to the thickness is preferably 0.042 to 1.6, more preferably 0.10 to 1.2, even more preferably 0.30 to 1.1, particularly preferably 0.35 to 0.58, and extremely preferably 0.40 to 0.50. Controlling the ratio within the range enables further enhancement of the following property of the polishing layer 110 to further improve the global flatness to be imparted to a surface to be polished.

The compressibility of the cushion layer 140 is preferably 5 to 60%, more preferably 20 to 55%, and even more preferably 30 to 50%. Controlling the compressibility to 5% or higher allows the cushion layer to exert the cushion effect more effectively, and thus the generation of a polishing mark can be further prevented and an influence due to a distortion of a polishing platen is decreased, which further improves the global flatness. Controlling the compressibility to 60% or lower can further prevent edge roll-off. In addition, the compressibility of the cushion layer 140 is preferably higher than the compressibility of the polishing layer 110. These allow the functions and effects of the present embodiment to be exerted more effectively and reliably. The compressive elastic modulus of the cushion layer 140 is preferably 85 to 100%, more preferably 90 to 100%, and even more preferably 95 to 100%. In addition, the compressive elastic modulus of the cushion layer 140 is preferably equal to or higher than the compressive elastic modulus of the polishing layer 110, and more preferably higher than the compressive elastic modulus of the polishing layer 110. These enable further enhancement of the global flatness to be imparted to a workpiece.

The density (bulk density) of the cushion layer 140 is preferably 0.13 to 0.50 g/cm$^3$, and more preferably 0.15 to 0.30 g/cm$^3$. In addition, the density of the cushion layer 140 is preferably equal to or higher than the density of the polishing layer 110, and more preferably higher than the density of the polishing layer 110. These allow the functions and effects of the present embodiment to be exerted more effectively and reliably.

The durometer hardness (Type A) of the cushion layer 140 is preferably 3 to 38°, and more preferably 5 to 31°. Controlling the durometer hardness within the range allows the cushion layer 140 to exert the effect to enhance the global flatness to be imparted to a workpiece more effectively and reliably. From the same viewpoint, the durometer hardness (Type A) of the cushion layer 140 is preferably lower than that of the polishing layer 110, and more preferably lower than that of the polishing layer 110 by 10° or more.

The above-described layers can be allowed to bond or adhere to each other by using a conventional method, and for example, can be allowed to bond or adhere to each other by using a double-sided adhesive tape including a pressure-sensitive adhesive or the like. In the case that the materials constituting the layers themselves have each adhesiveness or tackiness, the layers can be allowed to bond or adhere to each other by directly contacting the layers, or can be allowed to bond or adhere to each other by using the material constituting any of layers to adhere.

The polishing pad 100 according to the present embodiment is a polishing pad in which the 100% modulus of the resin constituting the polishing layer 110 is 8 to 25 MPa, and the polishing pad includes, in the side opposite to the polishing surface P of the polishing layer 110, the intermediate layer 120 having an amount of deformation C larger than that of the polishing layer 110, the hard layer 130 having an amount of deformation C smaller than that of the polishing layer 110, and the cushion layer 140 having an amount of deformation C larger than that of the intermediate layer 120, and the intermediate layer 120, the hard layer 130, and the cushion layer 140 are laminated in this order from the side of the polishing layer 110. This configuration, in particular the hard layer 130 and the cushion layer 140 included therein, inhibit localization of pressure to a workpiece, and in particular the intermediate layer 120 included improves the following property of the polishing layer 110 to a workpiece in a relatively small region. Further, the polishing pad 100 according to the present embodiment, owing to these configurations in combination with the configuration in which the 100% modulus of the resin constituting the polishing layer 110 is 8 to 25 MPa, can sufficiently reduce minute defects to be generated on a workpiece and make the global flatness to be imparted to the surface of a workpiece excellent, and as a result even a high polishing rate can be ensured.

In the polishing pad 100 according to the present embodiment, the total thickness of the polishing layer 110 and the intermediate layer 120 (the thickness of the laminate of them) is preferably 0.40 mm or larger and 1.3 mm or smaller, and more preferably 0.70 mm or larger and 1.0 mm or smaller. Controlling the thickness of the laminate of the polishing layer 110 and the intermediate layer 120 to 0.40 mm or larger enables further reduction of minute defects to be generated on a workpiece, and controlling the thickness to 1.3 mm or smaller can prevent the occurrence of roll-off (edge roll-off) of a workpiece due to polishing more effectively and reliably.

Now, a method for manufacturing the polishing pad 100 according to the present embodiment will be described. However, the manufacturing method is not limited to the following method. The method for manufacturing the polishing pad 100 includes laminating the intermediate layer 120, the hard layer 130, and the cushion layer 140 in the side opposite to the polishing surface P of the polishing layer 110 in this order from the side of the polishing layer 110. The method for manufacturing the polishing pad 100 may include providing a sheet for forming the polishing layer 110 (hereinafter, referred to as "first sheet"), a sheet for forming the intermediate layer 120 (hereinafter, referred to as "second sheet"), a sheet for forming the hard layer 130 (hereinafter, referred to as "third sheet"), and a sheet for forming the cushion layer 140 (hereinafter, referred to as "fourth sheet").

The first sheet, the second sheet, and the fourth sheet are each independently prepared as follows, for example. These sheets are formed by using what is called a wet film-forming method. Specifically, the wet film-forming method includes: preparing a resin solution containing a resin, a solvent, and, as necessary, additional materials (a step of resin solution preparation); applying the resin solution on the surface of a base material for film-formation (a step of application); coagulation and regenerating the resin in the resin solution to form a precursor sheet (a step of solidification and regeneration); removing the solvent from the precursor sheet to obtain a sheet (a step of solvent removal); and, as necessary, grinding and/or partially removing the sheet by using buff treatment (buffing) or slicing (a step of buffing/removing). The steps will be described in the following.

In the first step, the step of resin solution preparation, a resin solution is prepared by mixing a resin such as the above-described polyurethane resin, a solvent which can dissolve the resin therein and is miscible with a coagulation solution to be described later, and, as necessary, additional materials to be contained in a sheet, and, as necessary, defoaming the resultant under reduced pressure. The solvent is not limited, and examples thereof include N,N-dimethylformamide (hereinafter, abbreviated as "DMF") and N,N-dimethylacetamide. The content of the resin based on the total amount of the resin solution is not limited, and may be, for example, in the range of 10 to 50% by mass, or in the range of 15 to 35% by mass.

In the next step, the step of application, the resin solution is applied on a strip of a base material for film formation to form a coating film with a coating machine such as a knife coater, preferably at normal temperature. Then, the thickness of the resin solution to be applied can be appropriately adjusted so that the thickness of a sheet to be obtained finally reaches a desired thickness. Examples of the material of the base material for film formation include resin films such as PET films, fabrics, and nonwoven fabrics. Among them, resin films such as PET films, which are poorly permeable to liquid, are preferred.

In the next step, the step of solidification and regeneration, the coating film of the resin solution applied on the base material for film formation is continuously guided into a coagulation solution containing a poor solvent to the resin (e.g., water in the case of a DMF solution of a polyurethane resin) as a main component. In order to adjust the regeneration rate of the resin, an organic solvent such as a polar solvent other than the solvent contained in the resin solution may be added to the coagulation solution. The temperature of the coagulation solution is not limited as long as the temperature allows the resin to solidify, and for example, may be 15 to 65° C. In the coagulation solution, a skin film (skin layer) is first formed at an interface between the coating film of the resin solution and the coagulation solution, and numerous minute micropores (e.g., micropores 114b in the polishing layer 110) are formed in the resin in the close vicinity of the skin film. Thereafter, the regeneration of the resin having an open cell structure progresses by virtue of a concerted phenomenon of diffusion of the solvent contained in the resin solution into the coagulation solution and intrusion of the poor solvent into the resin. If the base material for film formation is poorly permeable to liquid (e.g., a PET film) in this stage, the coagulation solution does not permeate into the base material, and thus replacement between the solvent contained in the resin solution and the poor solvent preferentially occurs at a portion near the skin layer, and as a result larger pores (e.g., pores 114*a* in the polishing layer 110) tend to be generated in a region deeper than the portion near the skin layer. In this way, a precursor sheet is formed on the base material for film formation.

In the next step, the step of solvent removal, the solvent remaining in the precursor sheet formed is removed to obtain a sheet. For removing the solvent, a conventionally known washing solution can be used. The sheet after removing the solvent may be dried, as necessary. For drying the sheet, a cylinder dryer provided with a cylinder having a heat source inside may be used, for example, but the drying method is not limited thereto. In the case that a cylinder dryer is used, the precursor sheet is dried while passing along the periphery surface of the cylinder. Further, the sheet obtained may be wound into a roll.

In the next step, the step of buffing/removing, at least one surface of the sheet is ground and/or partially removed by using buffing or slicing. Buffing or slicing can homogenize the thickness of the sheet and can further flatten the surface of the sheet, which allows a pressing pressure onto a workpiece to distribute more homogeneously. As a result, minute defects to be generated on a workpiece can be further reduced and the global flatness to be imparted to a workpiece can be further improved. In this way, the first sheet, the second sheet, and the fourth sheet are obtained.

With regard to the third sheet, a film or sheet including any of the materials described for the hard layer 130 can be used, and the film or sheet may be a commercial product or a product synthesized by using a conventional method.

Subsequently, the sheets prepared are laminated in the above-mentioned order to obtain the polishing pad 100 according to the present embodiment in which the intermediate layer 120, the hard layer 130, and the cushion layer 140 are laminated in the side opposite to the polishing surface P of the polishing layer 110 in this order from the side of the polishing layer 110. For pasting the sheets, an adhesive, a pressure-sensitive adhesive, a double-sided adhesive tape including any of them, or the like can be used. For an adhesive, the material constituting any of layers to adhere may be used.

The method for polishing with the polishing pad 100 according to the present One specific example of the method will be described in the following. First, a holding platen of a single-side polishing machine is allowed to hold a workpiece. Subsequently, the polishing pad 100 is mounted on a polishing platen disposed opposite to the holding platen. A slurry (polishing slurry) containing abrasive grains (abrasive particles) are fed between the workpiece and the polishing pad 100, and simultaneously the workpiece is pressed onto the polishing pad 100 at a predetermined polishing pressure while the polishing platen or the holding platen is rotated. Thus, the workpiece is polished in chemical and mechanical polishing.

Examples of materials to which the polishing pad 100 according to the present embodiment is applied include semiconductors, silicon wafers for semiconductor devices, substrates for various recording disks, and glass substrates for liquid crystal displays. Among them, silicon wafers for semiconductor devices or the like are preferred from the viewpoint of possible utility as those with reduced minute defects.

Hereinabove, the present embodiment has been described in detail, but the present invention is never limited to the above embodiment of the present invention. For example, a polishing pad according to another embodiment of the present invention may be a polishing pad as illustrated in FIG. 2. FIG. 2 is a cross-sectional view schematically illustrating one example of a polishing pad according to another embodiment of the present invention. The polishing pad 200 has the same configuration as the above polishing pad 100 except that the cushion layer 140 is replaced with a cushion layer 240. The cushion layer 240 differs from the cushion layer 140 in that the skin layer region of the cushion layer 140 is located in the side of the hard layer 130 and in contrast the skin layer region of the cushion layer 240 is located in the side opposite to the hard layer 130, and the skin layer region is a surface to be buffed in the cushion layer 140 and in contrast the surface in the side opposite to the skin layer is a surface to be buffed in the cushion layer 240. Such a configuration of a surface to be buffed enables adjustment of the amount of deformation, compressibility, hardness, or the like. Owing to the configuration in which the polishing pad 200 includes the cushion layer 240, a region having relatively low density in the side opposite to the skin layer region is to be removed through buffing with the skin layer region, which has relatively high density, left inside. In order to further reduce the thickness variation of the cushion layer by buffing the fourth sheet, it is preferred to buff a region having relatively low density region in the side opposite to the skin layer region. This allows the skin layer region, which has relatively high density, to be left in the cushion layer, and thus the thickness variation of the cushion layer can be further reduced. Use of a cushion layer having small thickness variation and high flatness as the above cushion layer is particularly desirable because local variation of polishing load can be further reduced and the generation of polishing marks can be further prevented.

Although each of the polishing layer 110, the intermediate layer 120, and the cushion layer 140 is a layer formed by using what is called a wet film-forming method in the above embodiments of the present invention, each of the layers may be a layer formed by using a dry molding method, and a configuration in which any one of the layers is a layer formed by using a wet film-forming method and the other layers are each a layer formed by using a dry molding method may be used.

Further, the polishing pad according to the present invention may include, in addition to the above-described layers, an additional member which can be included in a conventional polishing pad. However, it is more preferred from the viewpoint of achieving the functions and effects of the present invention more effectively and reliably that the polishing layer 110, the intermediate layer 120, the hard layer 130, and the cushion layer 140 be laminated in this order and a member other than an adhesive or the like used for bonding or adhesion of the layers be not included between each layer. Accordingly, in the case that the polishing pad includes an additional member, it is desirable that the additional member be provided on the cushion layer 140 in the side opposite to the hard layer 130.

EXAMPLES

Hereinafter, the present invention will be described in more detail with reference to Examples, but the present invention is never limited to these Examples. The compressibility and compressive elastic modulus of each layer was measured as follows, and the 100% modulus of a resin, the density, durometer hardness, amount of deformation C, and amount of deformation D of each layer were measured as described above.

(Measurement of Compressibility and Compressive Elastic Modulus)

The compressibility and compressive elastic modulus of each layer was determined with a Schopper type thickness gauge (pressurizing surface: a disk having a diameter of 1 cm) in accordance with JIS-L1021-6. Specifically, at room temperature, an initial load was applied to a layer under no load was applied for 30 seconds, and then the thickness, t0, was measured. Subsequently, a final pressure was applied to the layer in a thickness of t0 and the layer was left to stand for 1 minute, and then the thickness, t1, was measured. The load was completely removed from the layer in the thickness t1, and after 1 minute of standing, the initial load was again applied to the layer for 30 seconds, and then the thickness, t0', was measured. The compressibility and compressive elastic modulus were calculated therefrom by using the following equations:

compressibility (%)=(t0−t1)/t0×100 compressive elastic modulus (%)=(t0'−t1)/(t0−t1)×100

In this measurement, the initial load was 100 g/cm² and the final pressure was 1120 g/cm².

Example 1

To a solution containing 30 parts by mass of a polyurethane resin (PU) of polyether MDI type having a 100% modulus of 10 MPa at 25° C. and 70 parts by mass of DMF, 60 parts by mass of DMF, 2.5 parts by mass of carbon black, a film-forming agent (trifunctional polypropylene glycol having a number average molecular weight of 2000; 1% by mass based on 100% by mass of the polyurethane resin), and a foam-controlling agent (dioctyl sulfosuccinate; 1% by mass based on 100% by mass of the polyurethane resin) were added first, and the resultant was mixed and stirred to obtain a resin solution. The viscosity at 25° C. was measured with a B-type rotational viscometer (product name "model TVB-10" manufactured by Toki Sangyo Co., Ltd.) to be 50 dPa·s (5000 cP).

Next, a strip of a PET film was prepared as a base material for film formation. The above resin solution was applied to the surface for application of the base material for film formation with a knife coater to obtain a coating film. The coating film obtained was then soaked in a coagulation bath containing water as a coagulation solution at room temperature so as to solidify and regenerate the resin, and thus a precursor sheet was obtained. The precursor sheet was taken out of the coagulation bath, and the precursor sheet was peeled off from the base material for film formation. Thereafter, the precursor sheet was soaked in a washing solution consisting of water at 70° C. (solvent removal bath) and the precursor sheet was dried at 120° C. to obtain a resin sheet. The surface of the resin sheet in the side of the skin layer region was then subjected to buffing to obtain a first sheet to form a polishing layer having a thickness of 0.47 mm and a durometer hardness (Type A) of 53°. The density, compressibility, compressive elastic modulus, and amount of deformation D of the first sheet (i.e., polishing layer) were as shown in Table 1.

Subsequently, a second sheet (i.e., intermediate layer) was obtained by using, as the polyurethane resin, a polyurethane resin of polyether MDI type having a 100% modulus of 10 MPa at 25° C. in the same manner as in the case of the first sheet except that the thickness, density, compressibility, compressive elastic modulus, and durometer hardness were set as shown in Table 1 and buffing was not performed. A fourth sheet (i.e., cushion layer) was obtained by using, as the polyurethane resin, a polyurethane resin of polyester MDI type having a 100% modulus of 6 MPa at 25° C. in the same manner as in the case of the first sheet except that the thickness, density, compressibility, compressive elastic modulus, and durometer hardness were set as shown in Table 1. Further, a PET sheet having a thickness as shown in Table 1 was prepared as a third sheet (i.e., hard layer).

Next, the second sheet was pasted on the non-buffed surface of the first sheet by using the same type polyurethane resin as used in producing the first sheet. Then, the third sheet was pasted on the surface of the second sheet in the side opposite to the surface pasted on the first sheet by using an adhesive (epoxy resin). Further, the buffed surface of the fourth sheet was pasted on the surface of the third sheet in the side opposite to the surface pasted on the second sheet by using a pressure-sensitive double-sided adhesive tape. Finally, a double-sided adhesive tape with a release sheet was pasted on the non-buffed surface of the fourth sheet to obtain a polishing pad.

The amount of deformation C was measured for each layer of the polishing pad obtained, and it was found that the relation among the amounts of deformation C was similar to the relation among the amounts of deformation D.

Examples 2 to 10 and Comparative Examples 1 to 6

Each polishing pad was obtained in the same manner as in Example 1 except that the sheets (layers) were modified as shown in Table 1. In Examples 6 and 8, buffing for the fourth sheet was performed for the surface of the resin sheet in the side opposite to the skin layer region and the buffed surface was pasted on the third sheet. In Example 8, a film-forming agent was not used in obtaining the first sheet, and the amount of the foam-controlling agent to be added was changed to 0.5% by mass based on 100% of the polyurethane resin. In Comparative Example 1, a second sheet (i.e., intermediate layer) and a third sheet (i.e., hard layer) were not prepared, and a first sheet and a nonwoven fabric as a fourth sheet were pasted together by using an adhesive. In Comparative Example 2, a second sheet (intermediate layer) was not prepared, and a first sheet and a third sheet were pasted together by using an adhesive.

The amount of deformation C was measured for each layer of each of the polishing pads obtained, and it was found that the relation among the amounts of deformation C was similar to the relation among the amounts of deformation D.

(Evaluation for Polishing)

By using each of the polishing pads obtained and a 300 mmϕ silicon wafer as a workpiece, polishing was carried out under the following conditions.

polishing machine: product name "PNX332B" manufactured by Okamoto Machine Tool Works, Ltd.
polishing load: 100 g/cm²
rotational frequency of platen: 30 rpm
rotational frequency of head: 30 rpm
flow rate of slurry: 1 L/min For a polishing slurry, product name "FGL3900RS" manufactured by Fujimi Incorporated was used. After polishing, the polished object was washed with a single wafer cleaner using low-etching conditions. Washing conditions were set so as to achieve an etching allowance such that the haze level measured with SP3 did not exceed 0.08 ppm.

For "Polishing rate", evaluation was performed with a capacitance flatness gauge (product name: "AFS") manufactured by ADE Corporation. Specifically, silicon wafers from which an oxide film had been removed by washing with HF were prepared first, and 25 sheets of the silicon wafers were polished for a polishing time 10 times longer than normal polishing time in sequence. The average allowance was calculated from the average thicknesses before and after the polishing, and the average polishing rate was determined for each of the 25 sheets. On the basis of the polishing rate in Comparative Example 1, the case that polishing rate reduction was less than 10% was rated as "A", and the case that polishing rate reduction was 10% or more was rated as "B". The results are shown in Tables 1 and 2.

For "Surface flatness", evaluation was performed with a light interference flatness gauge (product name: "Wafersight") manufactured by KLA-Tencor Corporation. Specifically, silicon wafers from which an oxide film had been removed by washing with HF were prepared first, and 16 sheets of the silicon wafers were subjected only to final polishing. The average value of ΔGBIR and the average value of ΔESFQR were calculated from the flatness measurements before and after the polishing, and the ΔGBIR and the ΔESFQR were used as indicators of flatness and edge roll-off, respectively. GBIR was measured under a condition of 2 mm EE (Edge Exclusion) and ESFQR was measured under a condition of 1 mm EE (angle: 5°, length: 10 mm). In the case that ΔGBIR based on the GBIR before polishing was 10% or less and ΔESFQR based on the ESFQR before polishing was 20% or less, the surface flatness was rated as "A". In the case that ΔGBIR based on the GBIR before polishing was 10% or less and ΔESFQR based on the ESFQR before polishing was more than 20%, the surface flatness was rated as "B". In the case that ΔGBIR based on the GBIR before polishing was more than 10%, the surface flatness was rated as "C".

For "Evaluation for polishing mark", evaluation was performed with a wafer surface inspection system (product name: "Surfscan SP3"). Specifically, for the polished object, the number of particles counted for a particle size of 18 nm was divided by the number of particles counted for a particle size of 26 nm, and the resultant (hereinafter, referred to as "increased amount of particles") was used for evaluation. The case that the increased amount of particles was 300 or more or over the detection limit was determined as having many particles, and rated as "C". The case that the increased amount of particles was 100 or more and less than 300 was determined as having not many particles, and rated as "B". The case that the increased amount of particles was 50 or more and less than 100 was determined as having a few particles, and rated as "A". The case that the increased amount of particles was 20 or more and less than 50 was determined as having few particles, and rated as "AA". The case that the increased amount of particles was less than 20 was determined as having very few particles, and rated as "AAA". The results are shown in Tables 1 and 2. Images of the minute defects on the surface of a polished object in Examples 6 and 8 and Comparative Examples 1 and 4 observed with the above-mentioned wafer surface inspection system are shown in FIG. 3.

TABLE 1

| | | Example 1 | Example 2 | Example 3 | Example 4 |
|---|---|---|---|---|---|
| Polishing layer (first sheet) | Resin | PU of polyether MDI type | PU of polyether MDI type | PU of polyether MDI type | PU of polyether MDI type |
| | 100% modulus (MPa) | 10 | 18 | 20 | 18 |
| | Thickness (mm) | 0.48 | 0.47 | 0.47 | 0.47 |
| | Density (g/cm$^3$) | 0.22 | 0.18 | 0.21 | 0.18 |
| | Compressibility (%) | 11.0 | 6.9 | 4.0 | 6.9 |
| | Compressive elastic modulus (%) | 97.2 | 88.7 | 92.3 | 88.7 |
| | Hardness (°) | 23.0 | 31.5 | 36.5 | 31.5 |
| | Opening diameter (μm) | 35.0 | 29.8 | 32.0 | 32.4 |
| | Amount of deformation D (μm) | 52.8 | 32.4 | 18.8 | 32.4 |
| | Thickness/amount of deformation D | 0.11 | 0.069 | 0.040 | 0.069 |
| Intermediate layer (second sheet) | Resin | PU of polyether MDI type | PU of polyether MDI type | PU of polyether MDI type | PU of polyether MDI type |
| | 100% modulus (MPa) | 10 | 10 | 10 | 6 |
| | Thickness (mm) | 0.40 | 0.40 | 0.40 | 0.41 |
| | Density (g/cm$^3$) | 0.21 | 0.21 | 0.21 | 0.21 |
| | Compressibility (%) | 15.0 | 15.0 | 15.0 | 49.5 |
| | Compressive elastic modulus (%) | 96.7 | 96.7 | 96.7 | 97.7 |
| | Hardness (°) | 22.5 | 22.5 | 22.5 | 12.5 |
| | Amount of deformation D (μm) | 60.0 | 60.0 | 60.0 | 203.0 |
| | Thickness/amount of deformation D | 0.15 | 0.15 | 0.15 | 0.50 |
| Hard layer (third layer) | Resin | PET | PET | PET | PET |
| | Thickness (mm) | 0.19 | 0.19 | 0.19 | 0.19 |
| | Compressibility (%) | 1.8 | 1.8 | 1.8 | 1.8 |
| | Hardness (°) | 93 | 93 | 93 | 93 |
| | Amount of deformation D (μm) | 3.4 | 3.4 | 3.4 | 3.4 |
| | Thickness/amount of deformation D | 0.018 | 0.018 | 0.018 | 0.018 |
| Cushion layer (fourth layer) | Resin | PU of polyester MDI type | PU of polyester MDI type | PU of polyester MDI type | PU of polyester MDI type |
| | 100% modulus (MPa) | 6 | 6 | 6 | 6 |
| | Thickness (mm) | 0.81 | 0.81 | 0.81 | 0.81 |
| | Density (g/cm$^3$) | 0.17 | 0.17 | 0.17 | 0.17 |
| | Compressibility (%) | 54.8 | 54.8 | 54.8 | 54.8 |

TABLE 1-continued

|  |  |  |  |  |  |
|---|---|---|---|---|---|
|  | Compressive elastic modulus (%) | 97.6 | 97.6 | 97.6 | 97.6 |
|  | Hardness (°) | 8.5 | 8.5 | 8.5 | 8.5 |
|  | Amount of deformation D (μm) | 443.9 | 443.9 | 443.9 | 443.9 |
|  | Thickness/amount of deformation D | 0.55 | 0.55 | 0.55 | 0.55 |
|  | Polishing rate | A | A | A | A |
|  | Surface flatness | A | A | A | A |
| Evaluation for | Rating | A | A | A | A |
| polishing mark | Increased amount of particles | 60 | 68 | 90 | 61 |

|  |  | Example 5 | Example 6 | Example 7 | Example 8 |
|---|---|---|---|---|---|
| Polishing layer (first sheet) | Resin | PU of polyether MDI type | PU of polyether MDI type | PU of polyether MDI type | PU of polyether MDI type |
|  | 100% modulus (MPa) | 18 | 18 | 18 | 18 |
|  | Thickness (mm) | 0.47 | 0.47 | 0.47 | 0.47 |
|  | Density (g/cm³) | 0.18 | 0.18 | 0.18 | 0.17 |
|  | Compressibility (%) | 6.9 | 6.9 | 6.9 | 5.5 |
|  | Compressive elastic modulus (%) | 88.7 | 88.7 | 88.7 | 74.1 |
|  | Hardness (°) | 31.5 | 31.5 | 31.5 | 36.0 |
|  | Opening diameter (μm) | 32.4 | 32.4 | 32.4 | 31.4 |
|  | Amount of deformation D (μm) | 32.4 | 32.4 | 32.4 | 25.9 |
|  | Thickness/amount of deformation D | 0.069 | 0.069 | 0.069 | 0.055 |
| Intermediate layer (second sheet) | Resin | PU of polyether MDI type | PU of polyether MDI type | PU of polyether MDI type | PU of polyether MDI type |
|  | 100% modulus (MPa) | 15 | 10 | 10 | 10 |
|  | Thickness (mm) | 0.40 | 0.40 | 0.40 | 0.40 |
|  | Density (g/cm³) | 0.21 | 0.21 | 0.21 | 0.21 |
|  | Compressibility (%) | 10.0 | 15.0 | 15.0 | 15.0 |
|  | Compressive elastic modulus (%) | 90.7 | 96.7 | 96.7 | 96.7 |
|  | Hardness (°) | 35.0 | 22.5 | 22.5 | 22.5 |
|  | Amount of deformation D (μm) | 40.0 | 60.0 | 60.0 | 60.0 |
|  | Thickness/amount of deformation D | 0.10 | 0.15 | 0.15 | 0.15 |
| Hard layer (third layer) | Resin | PET | PET | PET | PET |
|  | Thickness (mm) | 0.19 | 0.19 | 0.19 | 0.19 |
|  | Compressibility (%) | 1.8 | 1.8 | 1.8 | 1.8 |
|  | Hardness (°) | 93 | 93 | 93 | 93 |
|  | Amount of deformation D (μm) | 3.4 | 3.4 | 3.4 | 3.4 |
|  | Thickness/amount of deformation D | 0.018 | 0.018 | 0.018 | 0.018 |
| Cushion layer (fourth layer) | Resin | PU of polyester MDI type | PU of polyester MDI type | PU of polyester MDI type | PU of polyester MDI type |
|  | 100% modulus (MPa) | 6 | 6 | 20 | 6 |
|  | Thickness (mm) | 0.81 | 0.80 | 0.80 | 0.80 |
|  | Density (g/cm³) | 0.17 | 0.20 | 0.20 | 0.20 |
|  | Compressibility (%) | 54.8 | 44.4 | 8.0 | 44.4 |
|  | Compressive elastic modulus (%) | 97.6 | 97.0 | 91.2 | 97.0 |
|  | Hardness (°) | 8.5 | 11.0 | 31.0 | 11.0 |
|  | Amount of deformation D (μm) | 443.9 | 355.2 | 64.0 | 355.2 |
|  | Thickness/amount of deformation D | 0.55 | 0.44 | 0.080 | 0.44 |
|  | Polishing rate | A | A | A | A |
|  | Surface flatness | A | A | A | A |
| Evaluation for | Rating | A | AA | A | AAA |
| polishing mark | Increased amount of particles | 73 | 25 | 66 | 12 |

TABLE 2

|  |  | Example 9 | Example 10 | Comparative Example 1 | Comparative Example 2 |
|---|---|---|---|---|---|
| Polishing layer (first sheet) | Resin | PU of polyether MDI type | PU of polyether MDI type | PU of polyether MDI type | PU of polyether MDI type |
|  | 100% modulus (MPa) | 18 | 18 | 18 | 18 |
|  | Thickness (mm) | 0.47 | 0.47 | 0.47 | 0.47 |
|  | Density (g/cm³) | 0.18 | 0.18 | 0.18 | 0.18 |
|  | Compressibility (%) | 6.9 | 6.9 | 6.9 | 6.9 |
|  | Compressive elastic modulus (%) | 88.7 | 88.7 | 88.7 | 88.7 |
|  | Hardness (°) | 31.5 | 31.5 | 31.5 | 31.5 |
|  | Opening diameter (μm) | 29.8 | 29.8 | 29.8 | 29.8 |
|  | Amount of deformation D (μm) | 32.4 | 32.4 | 32.4 | 32.4 |
|  | Thickness/amount of deformation D | 0.069 | 0.069 | 0.069 | 0.069 |

TABLE 2-continued

| | | | | | |
|---|---|---|---|---|---|
| Intermediate layer (second sheet) | Resin | PU of polyether MDI type | PU of polyether MDI type | none | none |
| | 100% modulus (MPa) | 6 | 10 | | |
| | Thickness (mm) | 0.60 | 0.40 | | |
| | Density (g/cm³) | 0.21 | 0.21 | | |
| | Compressibility (%) | 45.8 | 15.0 | | |
| | Compressive elastic modulus (%) | 97.6 | 96.7 | | |
| | Hardness (°) | 14.0 | 22.5 | | |
| | Amount of deformation D (μm) | 274.8 | 60.0 | | |
| | Thickness/amount of deformation D | 0.46 | 0.15 | | |
| Hard layer (third layer) | Resin | PET | PET | none | PET |
| | Thickness (mm) | 0.19 | 0.19 | | 0.19 |
| | Compressibility (%) | 1.8 | 1.8 | | 1.8 |
| | Hardness (°) | 93 | 93 | | 93 |
| | Amount of deformation D (μm) | 3.4 | 3.4 | | 3.4 |
| | Thickness/amount of deformation D | 0.018 | 0.018 | | 0.018 |
| Cushion layer (fourth layer) | Resin | PU of polyester MDI type | PU of polyester MDI type | (nonwoven fabric) | PU of polyester MDI type |
| | 100% modulus (MPa) | 6 | 4 | — | 6 |
| | Thickness (mm) | 0.81 | 1.02 | 0.78 | 0.81 |
| | Density (g/cm³) | 0.17 | 0.28 | 0.39 | 0.17 |
| | Compressibility (%) | 54.8 | 60.0 | 16.0 | 54.8 |
| | Compressive elastic modulus (%) | 97.6 | 95.3 | 86.3 | 97.6 |
| | Hardness (°) | 8.5 | 2.0 | 37.0 | 8.5 |
| | Amount of deformation D (μm) | 443.9 | 612.0 | 124.8 | 443.9 |
| | Thickness/amount of deformation D | 0.55 | 0.60 | 0.16 | 0.55 |
| | Polishing rate | A | A | A | A |
| | Surface flatness | B | B | C | A |
| Evaluation for polishing mark | Rating | B | B | C | C |
| | Increased amount of particles | 154 | 177 | over detection limit | over detection limit |

| | | Comparative Example 3 | Comparative Example 4 | Comparative Example 5 | Comparative Example 6 |
|---|---|---|---|---|---|
| Polishing layer (first sheet) | Resin | PU of polyether MDI type | PU of polyether MDI type | PU of polyether MDI type | PU of polyether MDI type |
| | 100% modulus (MPa) | 6 | 28 | 18 | 18 |
| | Thickness (mm) | 0.46 | 0.47 | 0.47 | 0.47 |
| | Density (g/cm³) | 0.19 | 0.22 | 0.18 | 0.18 |
| | Compressibility (%) | 53.9 | 2.8 | 6.9 | 6.9 |
| | Compressive elastic modulus (%) | 96.8 | 64.5 | 88.7 | 88.7 |
| | Hardness (°) | 10.0 | 54.0 | 31.5 | 31.5 |
| | Opening diameter (μm) | 45.7 | 30.8 | 29.8 | 29.8 |
| | Amount of deformation D (μm) | 247.9 | 13.2 | 32.4 | 32.4 |
| | Thickness/amount of deformation D | 0.54 | 0.028 | 0.069 | 0.069 |
| Intermediate layer (second sheet) | Resin | PU of polyether MDI type | PU of polyether MDI type | PU of polyether MDI type | PU of polyether MDI type |
| | 100% modulus (MPa) | 10 | 10 | 23 | 10 |
| | Thickness (mm) | 0.40 | 0.40 | 0.40 | 0.40 |
| | Density (g/cm³) | 0.21 | 0.21 | 0.21 | 0.21 |
| | Compressibility (%) | 15.0 | 15.0 | 3.2 | 15.0 |
| | Compressive elastic modulus (%) | 96.7 | 96.7 | 89.7 | 96.7 |
| | Hardness (°) | 22.5 | 22.5 | 41.0 | 22.5 |
| | Amount of deformation D (μm) | 60.0 | 60.0 | 12.8 | 60.0 |
| | Thickness/amount of deformation D | 0.15 | 0.15 | 0.032 | 0.15 |
| Hard layer (third layer) | Resin | PET | PET | PET | PET |
| | Thickness (mm) | 0.19 | 0.19 | 0.19 | 0.19 |
| | Compressibility (%) | 1.8 | 1.8 | 1.8 | 1.8 |
| | Hardness (°) | 93 | 93 | 93 | 93 |
| | Amount of deformation D (μm) | 3.4 | 3.4 | 3.4 | 3.4 |
| | Thickness/amount of deformation D | 0.018 | 0.018 | 0.018 | 0.018 |
| Cushion layer (fourth layer) | Resin | PU of polyester MDI type | PU of polyester MDI type | PU of polyester MDI type | PU of polyester MDI type |
| | 100% modulus (MPa) | 6 | 6 | 6 | 21 |
| | Thickness (mm) | 0.81 | 0.81 | 0.81 | 0.78 |
| | Density (g/cm³) | 0.17 | 0.17 | 0.17 | 0.25 |
| | Compressibility (%) | 54.8 | 54.8 | 54.8 | 4.1 |
| | Compressive elastic modulus (%) | 97.6 | 97.6 | 97.6 | 79.8 |
| | Hardness (°) | 8.5 | 8.5 | 8.5 | 40.0 |
| | Amount of deformation D (μm) | 443.9 | 443.9 | 443.9 | 32.0 |
| | Thickness/amount of deformation D | 0.55 | 0.55 | 0.55 | 0.041 |

TABLE 2-continued

| | | | | | |
|---|---|---|---|---|---|
| | Polishing rate | B | A | A | A |
| | Surface flatness | C | A | A | C |
| Evaluation for polishing mark | Rating | B | C | C | C |
| | Increased amount of particles | 269 | over detection limit | 911 | 481 |

The present application is based on the Japanese patent application filed on May 21, 2014 (Japanese Patent Application No. 2014-105711), the content of which is incorporated herein by reference.

INDUSTRIAL APPLICABILITY

The present invention can provide a polishing pad capable of achieving a high polishing rate and sufficiently reducing minute defects to be generated after polishing on a polished object which are detected with a measuring apparatus capable of measuring defects for a particle size of 26 nm or smaller, and capable of providing the workpiece with excellent surface flatness. Accordingly, the present invention has industrial applicability in technical fields in which such performances are required.

REFERENCE SIGNS LIST 100, 200: polishing pad, 110: polishing layer, 120: intermediate layer, 130: hard layer, 140, 240: cushion layer

The invention claimed is:

1. A polishing pad comprising
a polishing layer having a polishing surface to polish a workpiece, and comprising, in a side opposite to the polishing surface of the polishing layer,
an intermediate layer having an amount of deformation C, which is defined as an amount of deformation in the case of compression in a thickness direction, larger than that of the polishing layer,
a hard layer having an amount of deformation C smaller than that of the polishing layer, and
a cushion layer having an amount of deformation C larger than that of the intermediate layer,
wherein the intermediate layer, the hard layer, and the cushion layer are laminated in this order from a side of the polishing layer, and an average opening diameter of openings in the polishing surface of the polishing layer is 10 to 50 μm.

2. A polishing pad comprising
a polishing layer having a polishing surface to polish a workpiece, and comprising, in a side opposite to the polishing surface of the polishing layer,
an intermediate layer having an amount of deformation C, which is defined as an amount of deformation in the case of compression in a thickness direction, larger than that of the polishing layer,
a hard layer having an amount of deformation C smaller than that of the polishing layer, and
a cushion layer having an amount of deformation C larger than that of the intermediate layer,
wherein the intermediate layer, the hard layer, and the cushion layer are laminated in this order from a side of the polishing layer,
the polishing layer, the intermediate layer, and the cushion layer each independently contain at least one resin selected from the group consisting of a polyurethane resin, a polysulfone resin, and a polyimide resin, and the hard layer contains at least one resin selected from the group consisting of a polyethylene terephthalate resin, a vinyl chloride resin, and a polyethylene resin.

3. A polishing pad comprising
a polishing layer having a polishing surface to polish a workpiece, and comprising, in a side opposite to the polishing surface of the polishing layer,
an intermediate layer having an amount of deformation C, which is defined as an amount of deformation in the case of compression in a thickness direction, larger than that of the polishing layer,
a hard layer having an amount of deformation C smaller than that of the polishing layer, and
a cushion layer having an amount of deformation C larger than that of the intermediate layer,
wherein the intermediate layer, the hard layer, and the cushion layer are laminated in this order from a side of the polishing layer,
the polishing layer, the intermediate layer, and the cushion layer are each a sheet formed by using a wet film-forming method, and a resin constituting the polishing layer, a resin constituting the intermediate layer, and a resin constituting the cushion layer have a 100% modulus of 8 to 25 MPa, 4 to 20 MPa, and 3 to 20 MPa, respectively.

4. The polishing pad according to claim 1 to be used for polishing a silicon wafer.

5. A method for manufacturing the polishing pad according to claim 1, comprising:
laminating, on a polishing layer having a polishing surface to polish a workpiece and having a 100% modulus of 8 to 25 MPa, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, in a side opposite to the polishing surface of the polishing layer, in this order from a side of the polishing layer.

6. A polishing pad comprising
a polishing layer having a polishing surface to polish a workpiece, and comprising, in a side opposite to the polishing surface of the polishing layer,
an intermediate layer having an amount of deformation C, which is defined as an amount of deformation in the case of compression in a thickness direction, larger than that of the polishing layer,
a hard layer having an amount of deformation C smaller than that of the polishing layer, and
a cushion layer having an amount of deformation C larger than that of the intermediate layer,
wherein the intermediate layer, the hard layer, and the cushion layer are laminated in this order from a side of the polishing layer,
the polishing layer has a thickness of 0.20 to 0.70 mm, the intermediate layer has a thickness of 0.20 to 0.60 mm, the hard layer has a thickness of 0.10 to 0.50 mm, the cushion layer has a thickness of 0.40 to 1.3 mm, and an average opening diameter of openings in the polishing surface of the polishing layer is 10 to 50 μm.

7. A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, the polishing layer has a thickness of 0.20 to 0.70 mm, the intermediate layer has a thickness of 0.20 to 0.60 mm, the hard layer has a thickness of 0.10 to 0.50 mm, the cushion layer has a thickness of 0.40 to 1.3 mm, the polishing layer, the intermediate layer, and the cushion layer each independently contain at least one resin selected from the group consisting of a polyurethane resin, a polysulfone resin, and a polyimide resin, and the hard layer contains at least one resin selected from the group consisting of a polyethylene terephthalate resin, a vinyl chloride resin, and a polyethylene resin.

8. A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, the polishing layer has a thickness of 0.20 to 0.70 mm, the intermediate layer has a thickness of 0.20 to 0.60 mm, the hard layer has a thickness of 0.10 to 0.50 mm, the cushion layer has a thickness of 0.40 to 1.3 mm, the polishing layer, the intermediate layer, and the cushion layer are each a sheet formed by using a wet film-forming method, and a resin constituting the polishing layer, a resin constituting the intermediate layer, and a resin constituting the cushion layer have a 100% modulus of 8 to 25 MPa, 4 to 20 MPa, and 3 to 20 MPa, respectively.

9. The polishing pad according to claim 6 to be used for polishing a silicon wafer.

10. A method for manufacturing the polishing pad according to claim 6, comprising:

laminating, on a polishing layer having a polishing surface to polish a workpiece and having a 100% modulus of 8 to 25 MPa, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, in a side opposite to the polishing surface of the polishing layer, in this order from a side of the polishing layer.

11. A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, a total thickness of the polishing layer and the intermediate layer, and the thickness of the cushion layer are both 0.40 to 1.3 mm, and an average opening diameter of openings in the polishing surface of the polishing layer is 10 to 50 μm.

12. A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, a total thickness of the polishing layer and the intermediate layer, and the thickness of the cushion layer are both 0.40 to 1.3 mm, the polishing layer, the intermediate layer, and the cushion layer each independently contain at least one resin selected from the group consisting of a polyurethane resin, a polysulfone resin, and a polyimide resin, and the hard layer contains at least one resin selected from the group consisting of a polyethylene terephthalate resin, a vinyl chloride resin, and a polyethylene resin.

13. A polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, a total thickness of the polishing layer and the intermediate layer, and the thickness of the cushion layer are both 0.40 to 1.3 mm, the polishing layer, the intermediate layer, and the cushion layer are each a sheet formed by using a wet film-forming method, and a resin constituting the polishing layer, a resin constituting the intermediate layer, and a resin constituting the cushion layer have a 100% modulus of 8 to 25 MPa, 4 to 20 MPa, and 3 to 20 MPa, respectively.

14. The polishing pad according to claim 11 to be used for polishing a silicon wafer.

15. A method for manufacturing a polishing pad comprising a polishing layer having a polishing surface to polish a workpiece, and comprising, in a side opposite to the polishing surface of the polishing layer, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, wherein the intermediate layer, the hard layer, and the cushion layer are laminated in this order from a side of the polishing layer, a total thickness of the polishing layer and the intermediate layer, and the thickness of the cushion layer are both 0.40 to 1.3 mm, and the method comprises laminating, on a polishing layer having a polishing surface to polish a workpiece and having a 100% modulus of 8 to 25 MPa, an intermediate layer having an amount of deformation C, which is defined as an amount of deformation in the case of compression in a thickness direction, larger than that of the polishing layer, a hard layer having an amount of deformation C smaller than that of the polishing layer, and a cushion layer having an amount of deformation C larger than that of the intermediate layer, in a side opposite to the polishing surface of the polishing layer, in this order from a side of the polishing layer.

16. The polishing pad according to claim 1, wherein the polishing layer, the intermediate layer, and the cushion layer each independently contain at least one resin selected from the group consisting of a polyurethane resin, a polysulfone resin, and a polyimide resin, and the hard layer contains at least one resin selected from the group consisting of a polyethylene terephthalate resin, a vinyl chloride resin, and a polyethylene resin.

* * * * *